(12) United States Patent
Takahashi

(10) Patent No.: US 7,189,601 B2
(45) Date of Patent: Mar. 13, 2007

(54) SYSTEM AND METHOD FOR FORMING MOLD CAPS OVER INTEGRATED CIRCUIT DEVICES

(75) Inventor: Yoshimi Takahashi, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 213 days.

(21) Appl. No.: 10/791,037

(22) Filed: Mar. 2, 2004

(65) Prior Publication Data

US 2005/0196908 A1   Sep. 8, 2005

(51) Int. Cl.
  *H01L 21/50* (2006.01)
  *H01L 21/48* (2006.01)
  *H01L 21/44* (2006.01)
(52) U.S. Cl. .................. 438/127; 438/112; 438/124; 438/126
(58) Field of Classification Search .............. None
See application file for complete search history.

(56) References Cited

U.S. PATENT DOCUMENTS

| | | | | | |
|---|---|---|---|---|---|
| 4,044,984 | A | * | 8/1977 | Shimizu et al. | 249/95 |
| 4,442,056 | A | * | 4/1984 | Slepcevic | 264/161 |
| 4,872,825 | A | * | 10/1989 | Ross | 425/117 |
| 5,733,802 | A | * | 3/1998 | Inoue et al. | 438/127 |
| 6,857,865 | B2 | * | 2/2005 | Tsai et al. | 425/116 |
| 6,987,032 | B1 | * | 1/2006 | Fan et al. | 438/122 |

* cited by examiner

*Primary Examiner*—Zandra V. Smith
*Assistant Examiner*—Khanh Duong
(74) *Attorney, Agent, or Firm*—Yingsheng Tung; Wade James Brady, III; Frederick J. Telecky, Jr.

(57) ABSTRACT

A compression molding method for forming a mold cap over an integrated circuit structure is provided. A film is positioned adjacent a first die structure such that a mold block coupled to the film is located in a die cavity in the first die structure. The mold block comprises mold compound and at least substantially holding its own shape. An integrated circuit structure including one or more integrated circuit devices coupled to a substrate is positioned adjacent a second die structure. At least one of the first die structure and the second die structure is moved toward the other die structure to cause the integrated circuit structure to compress the mold block within the die cavity in order to form a mold cap covering at least one of the one or more integrated circuit devices.

12 Claims, 3 Drawing Sheets

SYSTEM AND METHOD FOR FORMING MOLD CAPS OVER INTEGRATED CIRCUIT DEVICES

TECHNICAL FIELD OF THE INVENTION

This invention relates in general to chip packaging, and, more particularly, to systems and methods for forming mold caps over integrated circuit devices.

BACKGROUND OF THE INVENTION

As small consumer electronics such as mobile phones and personal digital assistants (PDAs) continue to proliferate at an unprecedented rate, the need for smaller and more reliable integrated circuit (IC) chip packaging has increased. IC chip packaging includes forming an encapsulant over the IC chips to protect the IC chips from being damaged by external factors. This encapsulant may be referred to as a "mold cap" formed over the IC chips. As the size of electronic devices decreases, there is a continuing need for thinner and thinner mold caps.

One current technique for forming mold caps over IC chips is transfer molding of encapsulant over IC chips. In transfer molding, an IC structure including IC chips affixed to a substrate is placed in a mold designed to allow encapsulation to a specified area. Mold compound is then liquefied by heat and pressure, and transferred into the mold. The mold cap solidifies around the IC chips as the mold compound is cooled. Transfer molding techniques are commonly used for encapsulating chip-size packages (CSP's). However, there are various problems commonly associated with transfer molding, particularly due to high operating temperatures and high pressures required to fill the mold. Such problems include incomplete filling of mold due to rapid curing of the mold compound, thermal stresses, displacement of bonding wires, and overpacking or resin bleed (commonly referred to as "flash"), for example.

Another current technique for forming mold caps over IC chips is compression molding using powderized mold compound. The powderized mold compound is spread out in a cavity in a mold die and an IC structure including IC chips affixed to a substrate is compressed into the powderized mold compound to form a solid mold cap around the IC chips. However, like the transfer molding techniques discussed above, compression molding using powderized mold compound suffers from various problems. Such problems include, for example, difficulties in evenly spreading a very thin layer of powderized mold compound into the mold die cavity, crumbling of the resulting mold cap, and inefficient machine tact time caused by the need to refill the mold die cavity with powder after each compression molding process.

SUMMARY OF THE INVENTION

In accordance with the present invention, mold caps are formed over integrated circuit (IC) devices using a compression molding process. In certain embodiments, IC devices are compressed into blocks of solid or paste mold compound pre-formed on release film that is subsequently removed from the capped IC device.

According to one embodiment, a compression molding method for forming a mold cap over an integrated circuit structure is provided. A film is positioned adjacent a first die structure such that a mold block coupled to the film is located in a die cavity in the first die structure. The mold block comprises mold compound and at least substantially holding its own shape. An integrated circuit structure including one or more integrated circuit devices coupled to a substrate is positioned adjacent a second die structure. At least one of the first die structure and the second die structure is moved toward the other die structure to cause the integrated circuit structure to compress the mold block within the die cavity in order to form a mold cap covering at least one of the one or more integrated circuit devices.

Various embodiments of the present invention may benefit from numerous advantages. It should be noted that one or more embodiments may benefit from some, none, or all of the advantages discussed below.

One advantage is that very thin mold caps may be formed that are highly uniform in shape, volume and density as compared with mold caps of similar dimensions formed by prior techniques. In certain embodiments, mold caps may be formed that have a width and/or length that are at least twenty times as large as the depth of the mold cap. For example, in a particular embodiment, mold caps may be formed having a width and length of approximately 50 mm and a depth of approximately 1 mm.

In addition, mold caps may be formed over a series of IC structure by advancing a release film having mold blocks formed thereon through a die assembly and performing a compression process for each mold block. As opposed to prior methods such as transfer molding or compression molding using powderized mold compound, this molding process need not be stopped in order to refill the mold cavity with new mold compound; rather, the release film is simply advanced such that the next mold block on the release film is positioned in mold cavity. Thus, the method may reduce the machine tact time per mold cap formed, thus increasing the efficiency of the method as compared with prior methods. In addition, in certain embodiments, little or no mold compound residue, such as particles, powder or liquid, is left in the die assembly, thus reducing the cleaning time of die assembly.

Other advantages will be readily apparent to one having ordinary skill in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Example embodiments of the present invention and their advantages are best understood by referring now to FIGS. 1 through 4 of the drawings, in which like numerals refer to like parts.

Among other things, various embodiments of the present invention are directed toward forming mold caps over integrated circuit (IC) devices using a compression molding process. In certain embodiments, IC devices are compressed into blocks of solid or paste mold compound pre-formed on release film that is subsequently removed from the capped IC device.

Figure 1:
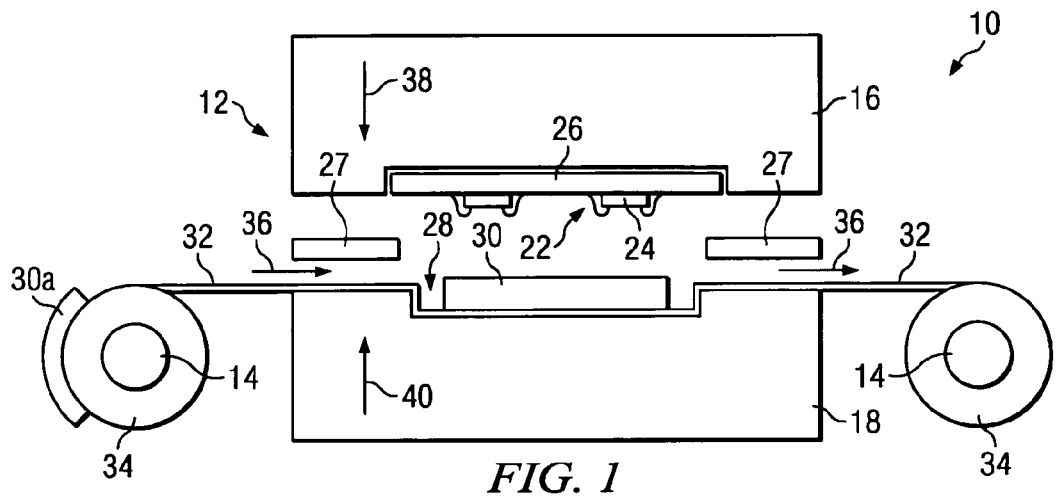
FIG. 1 illustrates a side view of a compression mold system for forming mold caps over IC devices using compression mold techniques according to an embodiment of the present invention.

FIG. 1 illustrates a side view of a compression mold system 10 for forming mold caps over IC devices using compression mold techniques according to an embodiment of the present invention. Compression mold system 10 includes a die assembly 12 and a film advancement apparatus 14. Die assembly 12 includes an upper die 16 and a lower die 18. Upper die 16 is configured to hold an IC structure 22, which may include one or more IC devices 24 coupled to a substrate 26, as discussed below with reference to FIG. 2. In some embodiments, such as the embodiment shown in FIG. 1, upper die 16 may include one or more portions 27 separate from the main structure of upper die 16, which may be operable to act as spacers within die assembly 12, or to hold IC structure 22 in place, for example.

Lower die 18 includes a die cavity 28 operable to accommodate one of a plurality of mold blocks 30 formed on a release film 32. In some embodiments, such as the embodiment shown in FIG. 1, die cavity 28 may be partially defined by one or more portions 27 of upper die 16. Release film 32 may lie on top of, or adjacent to, lower die 12 and may extend beyond each side of lower die 18. Release film 32 may be advanced through die assembly 12 by film advancement apparatus 14. In certain embodiments, such as shown in FIG. 1, release film 32 is formed in a roll 34 and film advancement apparatus 14 includes appropriate equipment for rotating roll 34 to advance release film 32 though die assembly 12. In the embodiment shown in FIG. 1, film advancement apparatus 14 advances release film 32 through die assembly 12 in the direction indicated by arrows 36.

In certain embodiments, release film 32 may have a thickness of approximately 30–50 microns and may have mold blocks 30 formed thereon. Such release film 32 having mold blocks 30 formed thereon may be rolled to form rolls 34, as discussed above, such as, for example, release film rolls manufactured by Nitto Denko Japan, located at 112 Shimohozumi Ibaraki, Osaka, Japan.

Mold blocks 30 comprise one or more mold compounds formed as a solid, gel, paste or other mass that at least substantially holds its shape as a block. For example, mold block 30 may include one or more of the following types of mold compounds: film compounds, partially-cured liquid compounds, B-stage compounds, solid compounds and/or powder compounds formed into a block shape.

In operation, an IC structure 22 is affixed to upper die 16 and release film 32 is advanced such that mold block 30 is located within cavity 28 formed in lower die 18, as shown in FIG. 1. Once IC structure 22 and mold block 30 are properly positioned, upper die 16 and/or lower die 18 may move toward each other in the directions shown by arrows 38 and 40, respectively, such that IC devices 24 are compressed into mold block 30. As IC devices 24 are compressed into mold block 30, mold block 30 deforms outwardly into the unfilled portions of cavity 28 around mold block 30. The compressed and deformed mold block 30 forms a mold cap over IC devices 24 that generally protects IC devices 24 from the outside environment, as discussed below with reference to FIG. 2B. This process of compressing mold block 30 to form a mold cap over IC devices 24 is generally referred to as compression molding.

Once the mold cap is formed as described above, die assembly 12 is opened (i.e., upper die 16 and/or lower die 18 move apart from each other) and film advancement apparatus 14 may advance release film 32 in the direction shown by arrows 36 such that the next mold block 30 on release film 32, indicated in FIG. 1 as mold block 30a, is located within cavity 28 in lower die 18. Another IC structure 22 may then be affixed to upper die 16 and compressed into mold block 30a in the manner described above. At some point, release film 32 is removed from mold caps formed over IC devices 24, leaving the IC devices 24 having mold caps compression molded thereon.

In certain embodiments, portions of upper die 16 may come into contact with portions of lower die 18 during the compression of IC devices 24 into mold block 30, causing one or more portions of release film 32 between such contacting portions of upper die 16 and lower die 18 to deform. Due to the thinness of release film 32, release film 32 may tear or otherwise fail if such deformed portions of release film 32 are again compressed between upper die 16 and lower die 18 during a subsequent compression molding process. Thus, as discussed in greater detail below with reference to FIG. 3, consecutive mold blocks 30 on release film 32 may be spaced sufficiently apart from each other such that no portion of release film 32 is compressed between contacting portions of upper die 16 and lower die 18 during multiple compression molding processes.

Figure 2A:
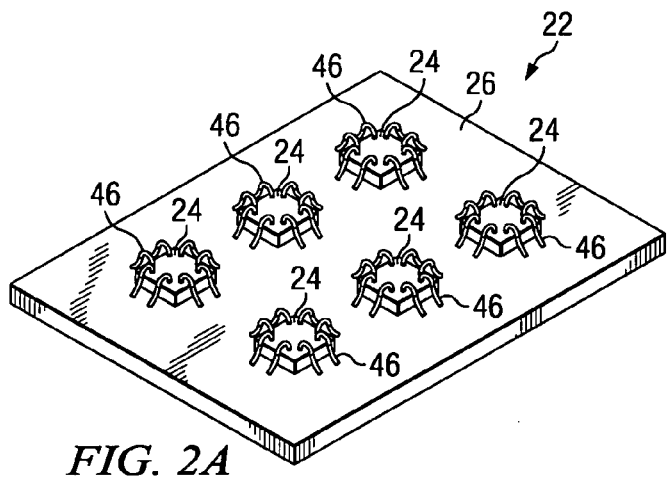
FIG. 2A illustrates an example IC structure including a number of IC devices coupled to a substrate.

FIG. 2A illustrates an example IC structure 22 before having a mold cap formed thereon. IC structure 22 includes six IC devices 24 wire bonded to IC substrate 26 by a number of gold wires 46. However, IC structure 22 may include any suitable number of IC devices 24 that may be attached to IC substrate 26 in any suitable manner without departing from the scope of the present invention. For example, IC structure 22 may include any suitable number of IC devices 24 attached by IC substrate 26 via wire bonding, flip-chip bonding, or tape automated bonding (TAB).

Figure 2B:
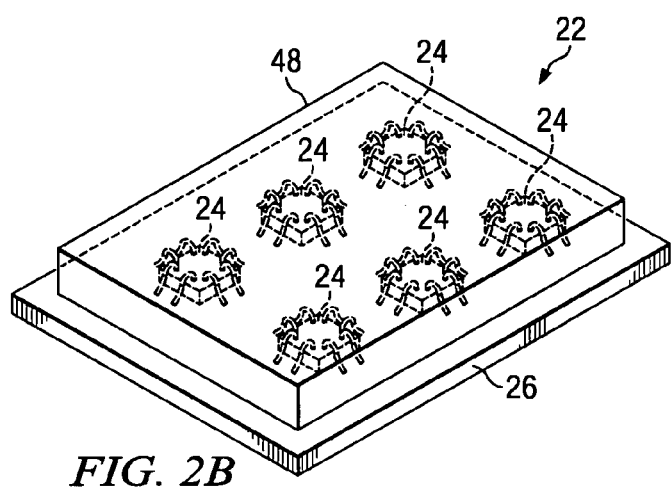
FIG. 2B illustrates an example IC structure having a mold cap covering the IC devices of the IC structure.
Figure 3:
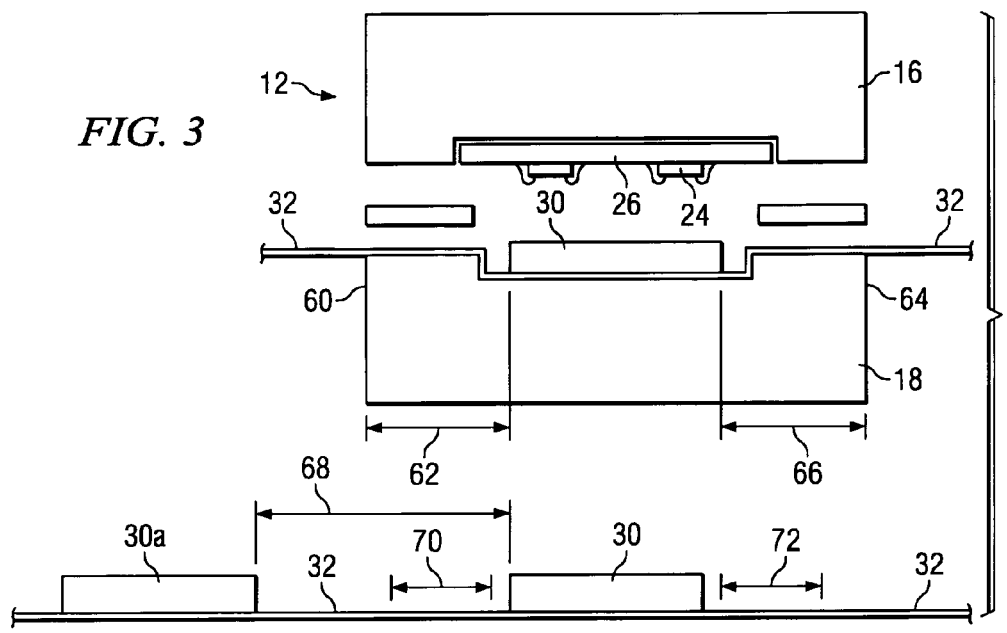
FIG. 3 illustrates the spacing of mold blocks on a film in certain embodiments of the present invention.

FIG. 2B illustrates an example IC structure 22 having a mold cap 48 formed thereon as discussed above with reference to FIG. 1. Mold cap 48 generally encapsulates IC devices 24 from the outside environment during further fabrication of the device in which IC structure 22 is incorporated and during the subsequent operation of IC devices 24. As discussed in greater detail below with reference to FIG. 5, the system and methods described herein may be used to form mold caps 48 that are generally flat and have very large width and length dimensions relative to a very small thickness dimension. FIG. 3 illustrates the spacing of mold blocks 30 on release film 32 in certain embodiments of the present invention. More particularly, FIG. 3 illustrates a side view of die assembly 12 and release film 32 having mold block 30 located with cavity 28 in lower die 18, as well as a side view of release film 32 having mold block 30 and following mold block 30a formed thereon. As discussed above, to prevent tearing or other failure of release film 32, consecutive mold blocks 30 may be spaced sufficiently apart from each other such that no portion of release film 32 is compressed between contacting portions of upper die 16 and lower die 18 during multiple compression molding processes.

As shown in FIG. 3, the distance between mold block 30 and a first side 60 of die assembly is indicated as distance 62, and the distance between mold block 30 and a second side 64 of die assembly is indicated as distance 66. The distance between successive mold blocks 30 on release film 32, such as mold blocks 30 and 30a, is indicated as distance 68. Portions of release film 32 on either side of mold block 30 that are deformed when compressed between upper die 16 and lower die 18 during the compression molding of mold block 30 are indicated as portions 70 and 72 of release film 32. In certain embodiments, distance 68 may be greater than or equal to the sum of distances 62 and 66 such that portions 70 and 72 of release film 32 that are deformed by die assembly 12 during the compression molding of mold block 30 are free of die assembly 12 when release film 32 is advanced for the compression molding of mold block 30a within cavity 28. Thus, no portion of release film 32 is compressed between contacting portions of upper die 16 and lower die 18 during consecutive compression molding processes, such as during the compression molding of mold blocks 30 and 30a, for example. As a result, the likelihood of release film 32 tearing or otherwise fails may be reduced or eliminated.

Figure 4A:
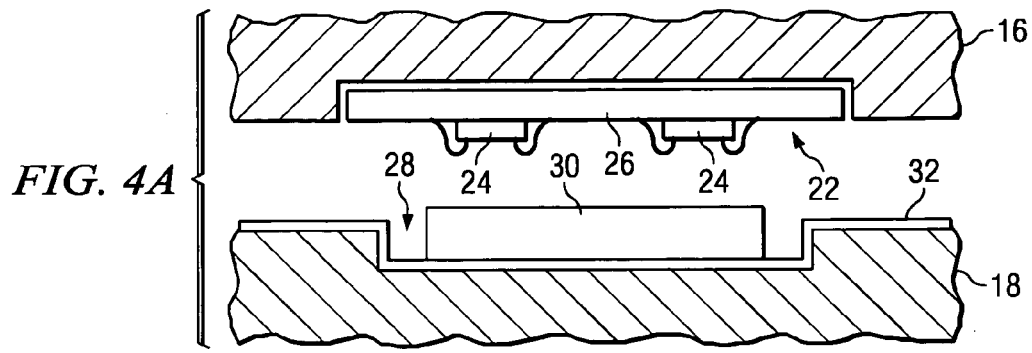
FIGS. 4A–4D illustrate an example method of forming a mold cap over IC devices using the compression mold system of FIG. 1 according to one embodiment of the present invention.
Figure 4B:
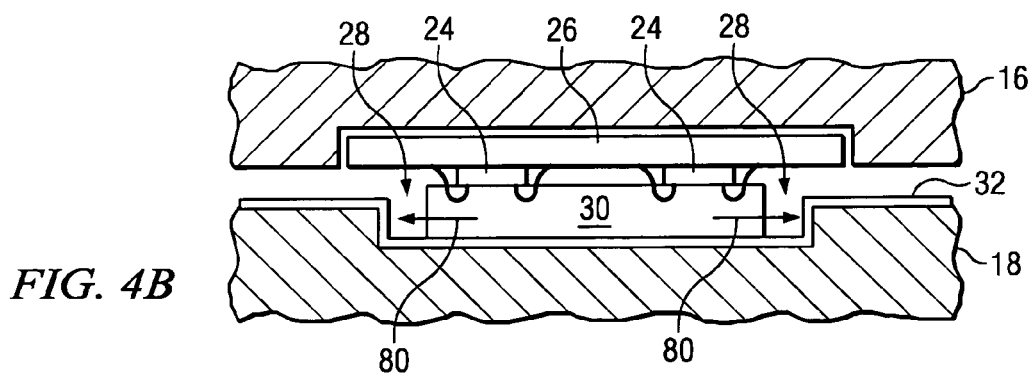

FIGS. 4A–4D illustrate an example method of forming mold cap 48 over IC devices 24 using compression mold system 10 according to one embodiment of the present invention. As shown in FIG. 4A, an IC structure 22 is affixed to upper die 16 and release film 32 is positioned such that mold block 30 is located within cavity 28 formed in lower die 18. Mold block 30 is shorter than cavity 28 in at least one direction such that one or more unfilled portions of cavity 28 exist around mold block 30. Once IC structure 22 and mold block 30 are positioned as shown in FIG. 4A, upper die 16 and/or lower die 18 may move toward each other as shown in FIG. 4B such that IC devices 24 are compressed into mold block 30. As IC devices 24 are compressed into mold block 30, mold block 30 deforms outwardly in the directions shown by arrows 80 to partially or completely fill one or more of the unfilled portions of cavity 28 around mold block 30.

Figure 4C:
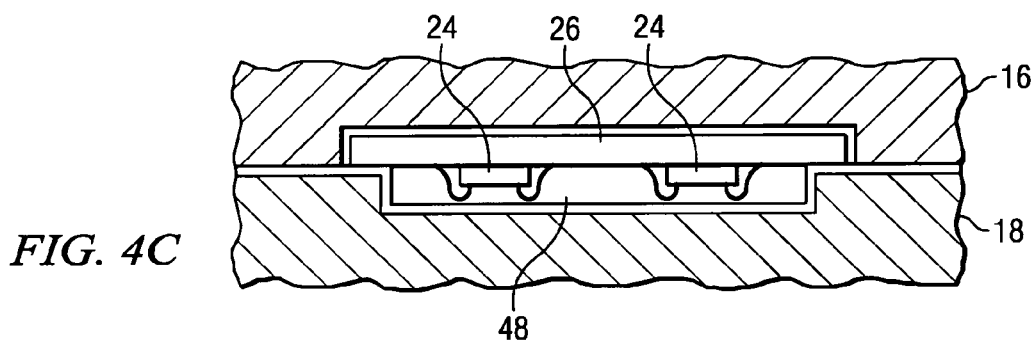
Figure 4D:
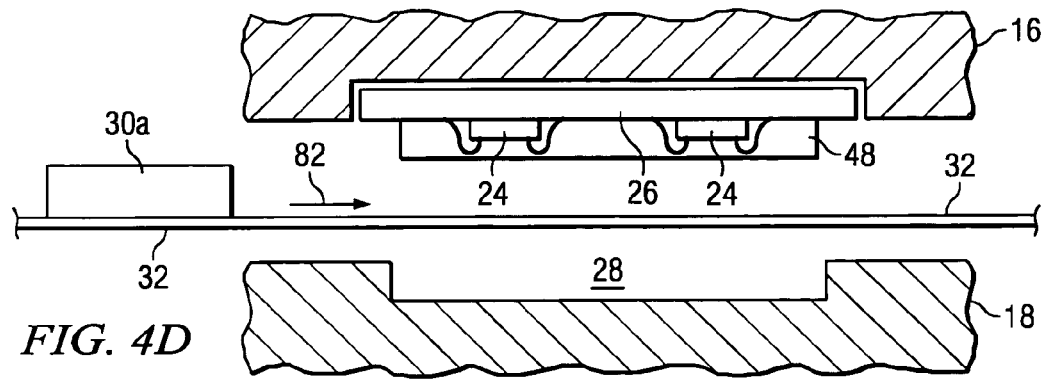

As shown in FIG. 4C, upper die 16 and/or lower die 18 may continue to move toward each other until upper die 16 and lower die 18 come into contact with each other. Mold cap 48, which comprises the mold compound from the deformed mold block 30, now covers IC devices 24. As shown in FIG. 4D, upper die 16 and/or lower die 18 may move apart from each other. Release film 32 may be released from mold cap 48, leaving IC structure 22 and mold cap 48 affixed to upper die 16. Release film 32 may then be advanced by film advancement apparatus 14 in the direction shown by arrow 82 and out of die assembly 12. Film advancement apparatus 14 may continue to advance release film 32 such that the next mold block on release film 32, indicated as mold block 30a, is positioned within cavity 28. The process shown in FIGS. 4A–4D may then be repeated to form a mold cap 48 for another IC structure 22 using mold block 30a.

In this manner, in certain embodiments, mold caps 48 may be formed over a series of IC structure 22 by advancing release film 32 through die assembly 12 and performing the compression process shown in FIGS. 4A–4D. As opposed to prior methods such as transfer molding or compression molding using powderized mold compound, the process need not be stopped in order to refill cavity 28 with new mold compound; rather, release film 32 is simply advanced such that the next mold block 30 is positioned in cavity 28. Thus, the method described herein may reduce the machine tact time per mold cap 48 formed, thus increasing the efficiency of the method as compared with prior methods. In addition, little or no mold compound residue, such as particles, powder or liquid, is left in die assembly 12 or other devices associated with the molding process, thus reducing the cleaning time of die assembly 12 and such other devices. Further, mold caps 48 formed as described herein may be highly uniform in shape, volume and density as compared with mold caps of similar dimensions formed by prior techniques.

Figure 5:
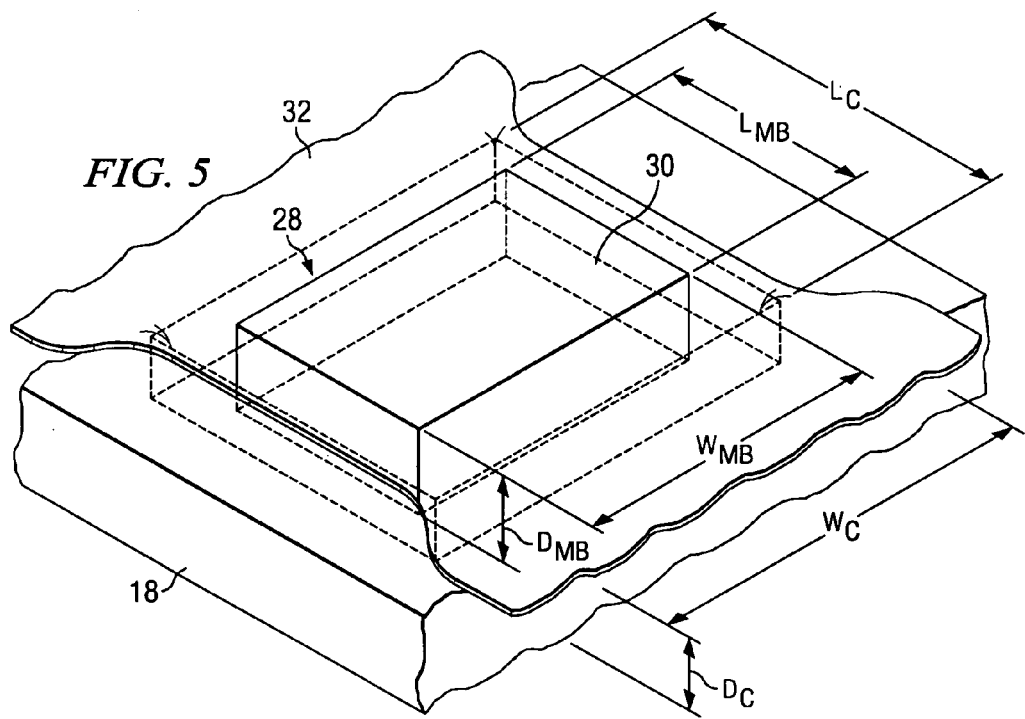
FIG. 5 illustrates example dimensions of a mold block relative to a cavity formed a lower die structure.

FIG. 5 illustrates example dimensions of mold block 30 relative to similar dimensions of cavity 28. The width, length and depth of mold block 30 are indicated by the dimensions $W_{mb}$, $L_{mb}$, and $D_{mb}$, respectively. Similarly, the width, length and depth of cavity 28 in lower die 18 are indicated by the dimensions $W_c$, $L_c$, and $D_c$, respectively. In certain embodiments, the width and/or length of mold block 30 ($W_{mb}$ and $L_{mb}$, respectively) are less than the width and/or length of cavity 28 ($W_c$ and $L_c$, respectively). In particular embodiments, each of the width and length of mold block 30, indicated by the dimensions $W_{mb}$ and $L_{mb}$, respectively, are less than or equal to 0.8 times the width and length of cavity 28 in lower die 18, indicated by the dimensions $W_c$ and $L_c$, respectively.

In addition, in certain embodiments, the volume of mold block 30 is approximately equal to or slightly greater than the volume of cavity 28 such that cavity 28 substantially fills up with mold compound from deformed mold block 30 during the compression molding process described above. Thus, in embodiments in which the width and/or length of mold block 30 ($W_{mb}$ and $L_{mb}$, respectively) are less than the width and/or length of cavity 28 ($W_c$ and $L_c$, respectively), the depth of mold block 30 ($D_{mb}$) may be greater than the depth of mold cavity 28 ($D_c$) such that the volume of mold block 30 is approximately equal to or slightly greater than the volume of cavity 28.

As discussed above, mold caps 48 formed using the system and methods described herein may be generally flat and have very large width and length dimensions relative to a very small thickness dimension. Thus, cavity 28 may have a very large width ($W_c$) and length ($L_c$) relative to a very shallow depth ($D_c$). In certain embodiments, one or both of the width ($W_c$) and length ($L_c$) of cavity 28 may be greater than twenty times the depth ($D_c$) of cavity 28 in order to form mold caps 48 having similar dimensions. For example, in certain embodiments, the width ($W_c$) and length ($L_c$) of cavity 28 are each approximately 50 mm whereas the depth ($D_c$) of cavity 28 is approximately 1 mm, such that the dimensions of cavity 28, and thus resulting mold caps 48, is 50 mm×50 mm×1 mm. As discussed above, in certain embodiments, the volume of mold block 30 is approximately equal to or slightly greater than the volume of cavity 28. In an embodiment in which the [width ($W_c$)]×[length ($L_c$)]×[depth ($D_c$)] of cavity 28 is approximately 50 mm×50 mm×1 mm, the volume of cavity 28 is approximately 2,500 cubic mm. Thus, in such an embodiment, the [width ($W_{mb}$)]×[length ($L_{mb}$)]×[depth ($D_{mb}$)] of mold block 30 may be approximately 40 mm×40 mm×1.56 mm, such that the volume of mold block 30 is also approximately 2,500 cubic mm.

In some embodiments, one or more dummy cavities may be coupled to cavity 28 and configured to receive excess, or overflow, mold compound from mold block 30 during the compression molding process described above. Alternatively, in some embodiments in which cavity 28 is at least partially defined by one or more portions 27, one or more dummy cavities may formed at least partially within such portions 27. Thus, the flow of mold compound from mold block 30 out of cavity 28 and into the area between portions of upper and lower dies 16 and 18 that are intended to contact each other (which flow of compound may be referred to as compound flash) may be reduced or eliminated.

Although embodiments of the invention and its advantages have been described in detail, a person skilled in the art could make various alterations, additions, and omissions without departing from the spirit and scope of the present invention as defined by the appended claims.

What is claimed is:

1. A compression molding method, comprising:
    positioning a film adjacent a first die structure such that a mold block coupled to the film is located in a die cavity in the first die structure, the mold block comprising mold compound and at least substantially holding its own shape; the cavity in the first die structure being wider than the mold block in a first direction such that one or more unfilled portions of die cavity exist around the mold block;
    positioning an integrated circuit structure adjacent a second die structure, the integrated circuit structure including one or more integrated circuit devices coupled to a substrate;
    moving the first die structure and the second die structure toward each other to cause the integrated circuit structure to compress the particular mold block within the die cavity in order to form a mold cap covering at least one of the one or more integrated circuit devices; and
    compressing the mold block causes the mold block to deform such that the mold compound of the mold block at least partially fills the one or more unfilled portions of the die cavity.

2. The method of claim 1, wherein:
    the die cavity in the first die structure is wider than the mold block in a first direction and longer than the mold block in a second direction; and
    the mold block is deeper than the die cavity in the first die structure in a third direction.

3. The method of claim 1, wherein the width of the mold block is less than or approximately equal to 0.8 times the width of the die cavity in the first direction and less than or approximately equal to 0.8 times the length of the die cavity in the second direction.

4. The method of claim 1, wherein the volume of the mold block is approximately equal to or slightly greater than the volume of the die cavity in the first die structure such that little or no mold compound escapes from the die cavity during the compression of the mold block.

5. The method of claim 1, wherein the mold compound comprises a solid, a gel or a paste.

6. The method of claim 1, wherein the mold compound comprises silicon.

7. The method of claim 1, further comprising:
    removing the film, mold cap, and integrated circuit structure from the die cavity; and
    advancing the film such that another mold block is located in the die cavity.

8. The method of claim 1, further comprising coupling a prefabricated film roll to a film advancement apparatus operable to advance the film such that the mold block coupled to the film is located in the die cavity, the prefabricated film roll comprising a roll of the film having a plurality of mold blocks coupled thereto.

9. The method of claim 1, wherein:
    a plurality of mold blocks are coupled to the film;
    and wherein moving at least one of the first die structure and the second die structure toward each other to cause the integrated circuit structure to compress the particular mold block within the die cavity causes one or more portions of the film to deform;
    the method further comprises advancing the film in a first direction such that a following mold block is located in the die cavity; and
    the distance between the two adjacent mold blocks is sufficient to ensure that following the advancement of the film the one or more deformed portions of the film are free from the area between the first die structure and the second die structure when the film is positioned such that the following mold block is located in the die cavity.

10. The method of claim 9, wherein:
    one or more surfaces of the first die structure come into contact with one or more surfaces of the second die structure during the compression of the mold block to form one or more contact regions;
    the distance between the two adjacent mold block is greater than or equal to the total length of the one or more contact regions in the first direction.

11. The method of claim 1, wherein at least one of the width or length of the die cavity is greater than twenty times the depth of the die cavity.

12. A compression molding method, comprising:
    coupling a prefabricated film roll to a film advancement apparatus, the prefabricated film roll comprising a roll of a film having a plurality of mold blocks coupled thereto;
    using the film advancement apparatus operable to advance the film such that a mold block coupled to the film is located in a die cavity in the first die structure, the mold block comprising mold compound and at least substantially holding its own shape, the mold compound comprising a solid, a gel or a paste;
    wherein the die cavity is wider than the mold block in a first direction and longer than the mold block in a second direction such that one or more unfilled portions of the die cavity exist around the mold block before the mold block is compressed;
    coupling an integrated circuit structure to a second die structure, the integrated circuit structure including one or more integrated circuit devices coupled to a substrate; and
    moving at least one of the first die structure and the second die structure toward the other die structure to cause the integrated circuit structure to compress the mold block within the die cavity to cause the mold block to deform such that the mold compound of the mold block at least partially fills the one or more unfilled portions of the die cavity and forms a mold cap covering at least one of the one or more integrated circuit devices.

* * * * *